US 6,628,130 B2

(12) United States Patent
Williams et al.

(10) Patent No.: US 6,628,130 B2
(45) Date of Patent: Sep. 30, 2003

(54) WIRELESS TEST FIXTURE FOR PRINTED CIRCUIT BOARD TEST SYSTEMS

(75) Inventors: Michael C. Williams, Loveland, CO (US); Robert A. Slutz, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 31 days.

(21) Appl. No.: 09/908,355

(22) Filed: Jul. 18, 2001

(65) Prior Publication Data

US 2003/0016039 A1 Jan. 23, 2003

(51) Int. Cl.[7] .............................................. G01R 31/02
(52) U.S. Cl. ...................................... 324/755; 324/761
(58) Field of Search ................................. 324/755, 757, 324/754, 758, 761, 158.1

(56) References Cited

U.S. PATENT DOCUMENTS

| | | | | |
|---|---|---|---|---|
| 4,352,061 A | * | 9/1982 | Matrone | 324/158.1 |
| 4,746,861 A | * | 5/1988 | Nesbitt | 324/761 |
| 4,977,370 A | * | 12/1990 | Andrews | 324/761 |
| 5,157,325 A | * | 10/1992 | Murphy | 324/761 |
| 5,485,096 A | * | 1/1996 | Aksu | 324/761 |
| 5,500,606 A | * | 3/1996 | Holmes | 324/761 |
| 5,510,722 A | * | 4/1996 | Seavey | 324/758 |
| 5,633,598 A | | 5/1997 | Van Loan et al. | |
| 5,945,836 A | * | 8/1999 | Sayre et al. | 324/761 |
| 5,945,838 A | * | 8/1999 | Gallagher et al. | 324/761 |
| 6,025,729 A | | 2/2000 | Van Loan et al. | 324/755 |
| 6,066,957 A | | 5/2000 | Van Loan et al. | 324/758 |
| 6,208,158 B1 | * | 3/2001 | Schein et al. | 324/761 |
| 6,225,817 B1 | * | 5/2001 | Sayre et al. | 324/761 |
| 6,294,908 B1 | * | 9/2001 | Belmore et al. | 324/158.1 |
| 6,326,799 B1 | * | 12/2001 | Schein | 324/754 |

FOREIGN PATENT DOCUMENTS

| | | | |
|---|---|---|---|
| EP | 0840131 | 7/1997 | |
| GB | 2344704 | 6/2000 | |
| GB | 2367369 | 4/2002 | |
| WO | WO 90/06518 | * 6/1990 | G01R/1/02 |

* cited by examiner

Primary Examiner—Ernest Karlsen
Assistant Examiner—Jermele Hollington

(57) ABSTRACT

A wireless test fixture is disclosed for connecting printed circuit boards or other electrical interconnect devices having electronic components to a test system. Rigid support beams and insulating spacers are used to reduce the structural loads on the electrical interconnect plane and to minimize probe mounting plate deflections in the wireless test fixture. The test system electrical interface is via a series of floating transfer pins. The floating transfer pins provide electrical signal paths between test system interface probes and the electrical interconnect plane that interfaces with double-end sockets coupled to a probe for making electrical contact with the DUT. One or more fixed double-ended sockets and spring probes are used to make electrical contact with the DUT.

23 Claims, 2 Drawing Sheets

WIRELESS TEST FIXTURE FOR PRINTED CIRCUIT BOARD TEST SYSTEMS

BACKGROUND OF THE INVENTION

1. Technical Field

The present invention relates generally to test equipment used to test printed circuit boards and more specifically to the use of a wireless fixture in a printed circuit board test system.

2. Discussion of the Prior Art

After printed circuit boards (PCB's) or other electrical interconnect planes or devices have been manufactured and loaded with components, and before they can be used or placed into assembled products, they should be tested to verify that all required electrical connections have been properly completed and that all necessary electrical components have been attached or mounted to the board in proper position and with proper orientation. Other reasons for testing printed circuit boards are to determine and verify whether the proper components have been used and whether they are of the proper value. It is also necessary to determine whether each component performs properly (i.e., in accordance with the specification). Some electrical components and electro-mechanical components also may require adjustment after installation.

Loaded-board testing has complex multiplexed tester resources and is capable of probing soldered leads, vias and testpads on loaded boards with topside and bottom side components. Loaded-board testing includes analog and digital tests, such as tests for electrical connectivity, voltage, resistance, capacitance, inductance, circuit function, device function, polarity, vector testing, vectorless testing, and circuit functional testing. Loaded-board testing requires very low contact resistance between the test targets and the fixture components.

Advances in circuit board and electronic component packaging technology have escalated the probe spacing demands placed on loaded-board test equipment. Existing state-of-the-art technology requires loaded-board test equipment capable of accessing test targets which are spaced apart by 50 mils (center to center) or less, where test targets are physical features on a PCB or electronic component which may be probed during testing. One of the greatest challenges faced by loaded-board test equipment manufacturers now and in the future is a high false failure and test malfunction rate caused by physical and electrical contact problems. These problems are exacerbated by existing fixture limitations in probing accuracy, probing pitch (center to center spacing), and surface contamination.

As component and board geometries shrink and become denser, loaded-board testing becomes more difficult using standard fixtures. Existing shortwire, loaded-board fixtures can consistently hit test targets equal to or greater than 35 mils in diameter with equal to or greater than 75-mil pitch. Targets that are smaller or more closely spaced cannot be probed with consistency due to prohibitive component and system tolerance stack-ups.

A variety of test fixtures have heretofore been available for testing loaded boards on test equipment. A device under test (DUT) often embodies a PCB loaded with electronic components and electronic hardware. One approach that addresses the limited-access problems during testing is the use of wireless fixtures. The term "limited-access" refers to something that cannot easily be reached, or accessed, due to physical restrictions or constraints. For example, a limited-access PCB may contain many targets that are too closely spaced to accurately probe using existing fixture technology.

The term "standard-access" refers to that which can be reached, or accessed, using existing fixture technology. The use of wireless fixtures allows a greater coupling of test targets to test resources. FIG. 1 shows one wireless fixture that attempts to address limited-access problems during testing. The wireless fixture of FIG. 1 shows a fragmentary cross-sectional view of a representative wireless fixture that is currently used in the Agilent 3070 test system. The PCB 120 provides electrical connections between pins 100 and double-ended sockets 20. The PCB 120 also has holes for mounting screws 80. This PCB 120 has permanently attached pins 100. The test system interface probe 90 provides the interface between the PCB 120 and the test system. The test system interface probe 90 allows the pin 100 to provide an electrical interface between the PCB 120 and the test system. The alignment plate 110 is used to orient the pin 100 properly with respect to the test system interface. The double-ended socket 20 is a receptacle for a standard spring probe 30 used to make electrical contact to the DUT 130. The double-ended socket 20 is press mounted into the probe mounting plate 10 and has a spring loaded probe tip that makes electrical contact to PCB 120. Probe mounting plate 10 is attached to the fixture frame 40, which is coupled to alignment plate 110. A guide plate 70, comprising a thin insulating sheet, is used to protect the double-ended socket 20 during assembly. The guide plate 70 is oriented relative to the probe mounting plate 10 and the PCB 120 by the use of a standoff 50 between the guide plate 70 and the probe mounting plate 10 and a standoff 60 between the PCB 120 and the guide plate 70. A number of screws 80 are used to resist the spring forces generated by the double end sockets 20 and the test system interface probes 90. These screws 80 pass through the PCB 120, then the first standoff 60, the guide plate 70, the second standoff 50, and finally enter the probe mounting plate 10.

Current wireless fixtures need to assemble the printed circuit board by attaching pins and require the printed circuit board to carry loads imposed by springs used in electrical contacts. Installation and soldering of pins onto a circuit board is not a common process for typical fixture builders. The materials typically used for constructing printed circuit boards are not very stiff. The travel distance for the probe tip in a typical double-ended socket is 0.100 inch so PCB supports must be close together to adequately control deflection of the PCB. In current implementations this leads to the use of a large number of screws and standoffs for mounting the PCB to the probe mounting plate. In order to keep the PCB relatively flat during fixture assembly these mounting screws must be carefully tightened in small increments. This is very time consuming and is a decrement to disassembling the fixture if changes are needed. The standoffs and screws must be located where double ended sockets are not required. Determining an adequate number of mounting screws and locating them must be done before the PCB can be routed which can lead to longer fixture build times. The space needed for the mounting holes in the PCB takes away space for routing traces and can increase the number of layers required which increases the cost of the PCB.

There is a need for an improved wireless test fixture that places less reliance on the printed circuit board or other electrical interconnect device as a structural element, that causes less deflection of the PCB due to contact forces, and that does not require screw holes in the area of double ended sockets. There is a further need for such an improved wireless test fixture that has an assembly process that does not require pins to be attached to the PCB, that allows the PCB to be routed independent of spacer location, that is easier to assemble and disassemble when changes must be made, and that allows faster assembly due to the reduction in the number of screws required. There is a further need in the art for a wireless fixture that allows the reuse of some components when the wireless fixture is retired.

SUMMARY OF THE INVENTION

It is an object of the invention to allow routing of the printed circuit board or other electrical interconnect plane in the wireless test fixture independent of spacer location.

It is further an object of the invention that the wireless test fixture use pins separate from the printed circuit board.

It is further an object of the invention that the assembly of the wireless test fixture be faster due to the reduction in the number of screws required.

It is yet another object of the invention that the wireless test fixture assembly be easier to assemble and disassemble when changes must be made.

It is another object of the invention that less reliance be placed on the printed circuit board or other electrical interconnect plane as a structural element.

It is further an object of the invention that some components of the wireless test fixture be reusable.

Therefore, according to the structure of the present invention, a wireless test fixture for the testing of loaded printed circuit boards is disclosed. The wireless test fixture electrically connects one or more test targets on a loaded printed circuit board (device under test) with interface probes of a test system. The test fixture contains a probe mounting plate, constructed from epoxy-glass or similar material. Double-ended sockets for wireless fixtures press-fit into corresponding holes in the probe mounting plate. Spring probes are coupled to the double-ended sockets, and the spring probes are used to establish electrical contact to the device under test. An upper frame is coupled to the probe mounting plate, and the upper frame is able to support the probe mounting plate and provide reference information for placing the upper frame with respect to the electrical interconnect plane in the wireless test fixture. A lower frame is coupled to the upper frame and also coupled to an insulating spacer element, which supports the electrical interconnect plane. The lower frame also provides reference information for locating the upper frame with respect to the electrical interconnect plane and the test system. The electrical interconnect plane is often a printed circuit board, but may also be a printed circuit board that is loaded with electrical and optical components. These components may be used to facilitate the testing process applied to the DUT.

The wireless fixture also contains spacer elements that are able to provide mechanical support and electrical insulation to the electrical interconnect plane. These spacer elements mount between, but are not coupled to, the probe mounting plate and the electrical interconnect plane. Bottom support bars are coupled to the lower frame, and provide mechanical support to the electrical interconnect plane in the wireless test fixture. In one embodiment, the bottom support bars are part of the lower frame. The bottom support bars also support pin carriers that retain and position floating transfer pins that make electrical contact to the electrical interconnect plane. Test system interface pins are spring probes that make electrical contact to the floating transfer pins. The electrical path through the floating transfer pins, the electrical interconnect plane, and the double-ended sockets provide test system access to various test targets of the device under test.

BRIEF DESCRIPTION OF THE DRAWINGS

The novel features believed characteristic of the invention are set forth in the claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
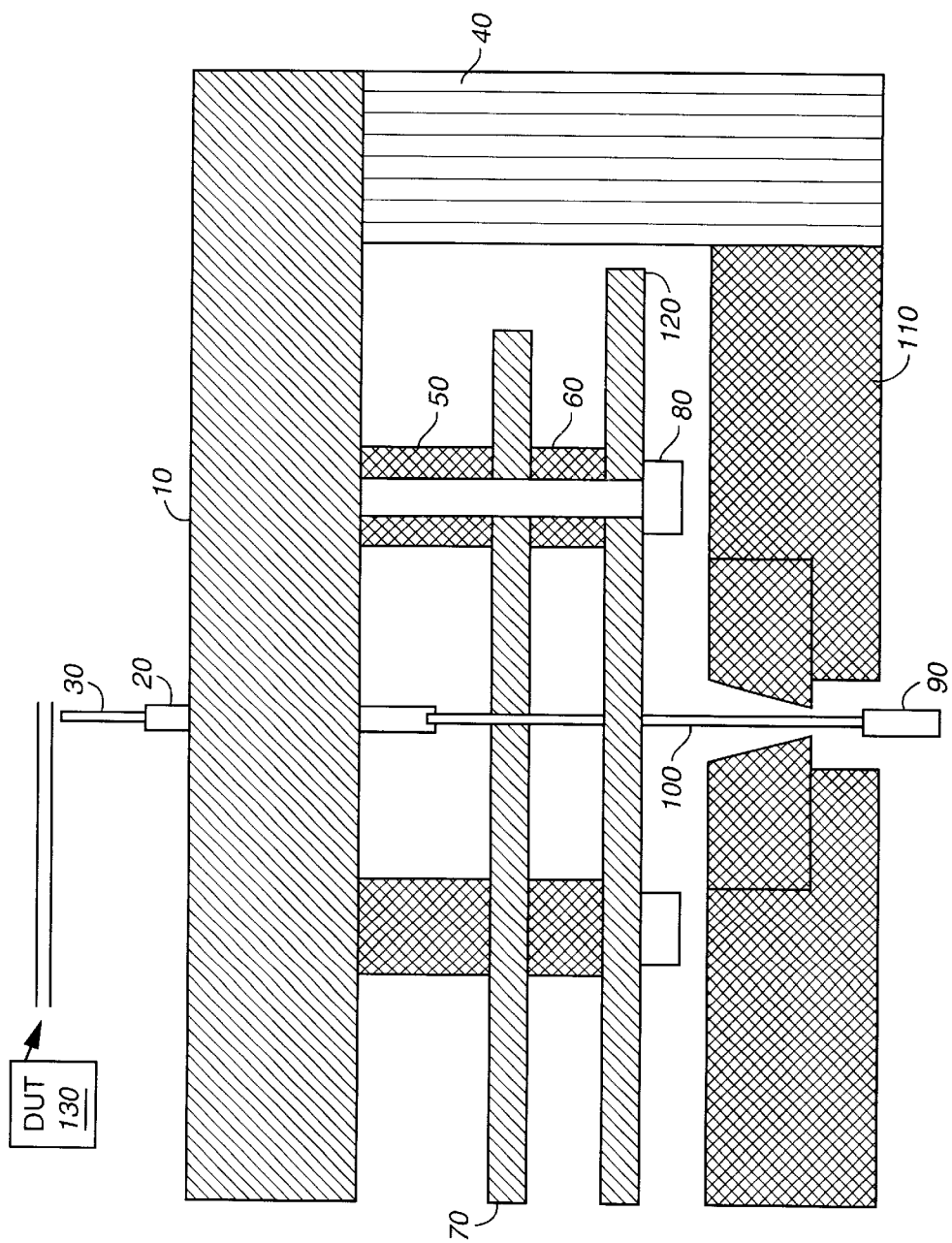
FIG. 1 shows a fragmentary cross-sectional view of a wireless fixture, according to the prior art.
Figure 2:
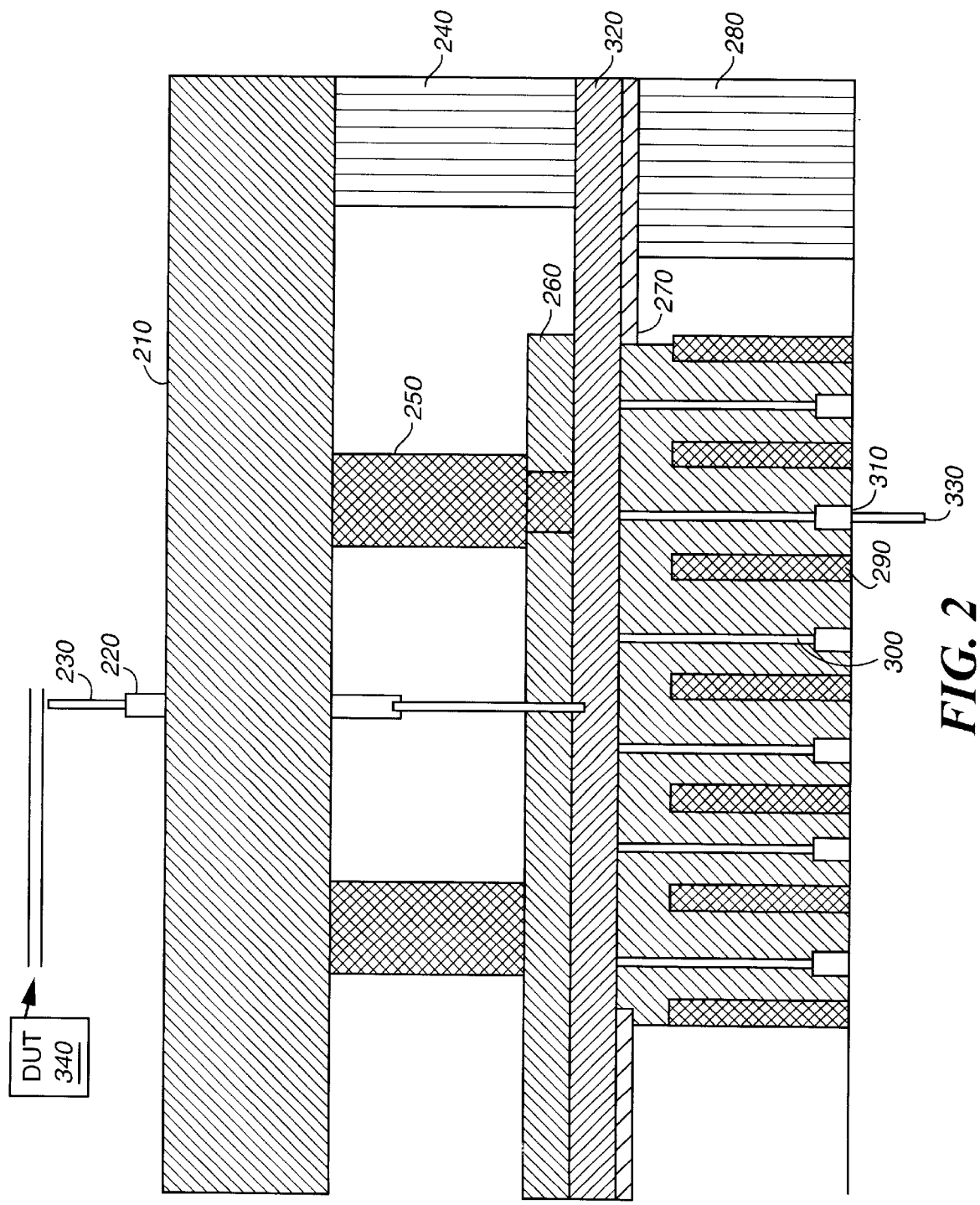
FIG. 2 shows a cross-sectional view of the preferred embodiment of a wireless fixture, according to the present invention.

The present invention discloses a structure for the wireless testing of electrical interconnect devices. Referring now to FIG. 2, a fragmentary cross-sectional view of the preferred embodiment is shown. A probe mounting plate 210, made of stiff insulating material, is coupled to a double-ended socket 220 for wireless fixtures. In the preferred embodiment, the probe mounting plate is constructed of epoxy glass. Double-ended socket 220 mounts into a hole in probe mounting plate 210. The double-ended socket 220 is coupled to a probe 230 used to make contact with a device under test (DUT) 340. In the preferred embodiment of the present invention, the probe 230 is a spring probe. Note that it is also possible to use technologies other than the double-ended receptacles available from fixture component suppliers. An exemplary technology is that provided by Everett Charles Technologies, which manufacture Stealth™ fixture components.

The probe mounting plate 210 is mounted on an upper frame 240. The upper frame 240 provides details for locating and a stiff structure for supporting the probe mounting plate 210. Upper frame 240 also provides detail for the accurate location of upper frame 240 with respect to a lower frame 280. The upper frame 240 is separated from the lower frame 280 by an electrical interconnect plane 320 and an insulating spacer 270 located between the lower frame 280 and the electrical interconnect plane 320. In the preferred embodiment, the electrical interconnect plane 320 is a printed circuit board (PCB) but may be any electrical plane capable of providing electrical interconnectivity to the test fixture. The lower frame 280 provides support and location for a plurality of bottom support bars 290, one or more pin carriers 310, and the electrical interconnect plane 320. The lower frame 280 also has details for accurate location with respect to the upper frame 240 and with test system interface pins 330. Note that in the preferred embodiment of the present invention, the lower frame 280 is coupled to directly to the upper frame 240. It is also possible in an alternative embodiment for the lower frame 280 to be coupled to the insulating spacer 270. The insulating spacer 270 is then coupled to the electrical interconnect plane 320.

In the preferred embodiment, the electrical interconnect plane 320 is located below a guide plate 260, and above the insulating spacer 270. Guide plate 260 is recommended by socket manufacturers, while the insulating spacer 270 is used to provide support and insulation for electrical interconnect plane 320 where not provided by the pin carriers 310. The insulating spacer 270 is coupled from below to the lower frame 280 and is operable to be coupled to one or more of the plurality of bottom support bars 290. Bottom support bars 290 may be an integral part of lower frame 280, or may be separate components that are attached to and supported by lower frame 280. The bottom support bars 290 oppose the force exerted by the double-ended sockets 220. When the DUT 340 is pushed down onto spring probes 230, the load from compressing the springs is applied to probe mounting plate 210. Deflections in the probe mounting plate 210 due to this force are reduced since part of the force is transmitted through the spacers 250 to the bottom support bars 290.

The pin carriers 310 guide and retain a plurality of floating transfer pins 300. Pin carriers 310 also serve as an insulating spacer between bottom support bars 290 and electrical interconnect plane 320. The floating transfer pins 300 provide electrical connections between test system interface pins 330 and the electrical interconnect plane 320. The test system interface pin 330 provides an electrical signal path between the test fixture and the test system. In the preferred embodiment, spring forces for the electrical contact between test system and electrical interconnect plane 320 are provided by the test system interface pins 330. An alternative embodiment could use short spring probes retained in the pin carrier 310. These spring probes would provide contact forces to the electrical interconnect plane 320 and the test system interface pins 330 would provide contact force to the stationary end of the spring probes.

Thus, in the preferred embodiment an electrical signal applied by the test system is received by a particular test system interface pin 330. Test system interface pin 330 then utilizes a floating transfer pin 300 to apply the electrical signal to the electrical interconnect plane 320. The spring forces generated by system interface pin 330 are opposed by the spacers 250, which transfer the load to probe mounting plate 210. Electrical interconnect plane 320 routes the electrical signal from the floating transfer pin 300 to the appropriate double-ended socket 220. Also in the preferred embodiment, an electrical signal applied by the test system is receivable by the spring probe 230 housed in double-ended socket 220. The spring probe 230 is directly coupled to the DUT 340 so that the electrical signal is applied to the DUT 340 by spring probe 230. The forces generated by pressing the DUT 340 onto the spring probe 230 are received by the probe mounting plate 210. The stability of the probe mounting plate 210 is enhanced through the use of the spacers 250, which oppose any movement of probe mounting plate 210 due to the forces generated by pressing the DUT 340 onto spring probe 230.

In accordance with the wireless test fixture described above, the test system user is able to route the printed circuit board or other electrical interconnect plane independent of spacer location. The wireless test fixture also utilizes pins that are separate from the electrical interconnect plane. The mechanical design of the wireless test fixture may be assembled and disassembled more easily than the design provided in the prior art, and assembly is also faster due to the reduction in the number of screws required. The location and placement of spacer elements, the probe mounting plate, the lower and upper frame, and guide elements reduce the mechanical stresses and strains on the electrical interconnect plane. Because no components are permanently connected to the electrical interconnect plane some components within the wireless test fixture can also be reused.

While the invention has been particularly shown and described with reference to a preferred embodiment, it will be understood by those skilled in the art that various changes in form and detail may be made therein without departing from the spirit and scope of the invention. For example, one of ordinary skill in the art will recognize that any number of spring probes 230 and double ended sockets 220 may be coupled to probe mounting plate 210 in various locations, without departing from the spirit and scope of the invention. Further, the location and amount of floating transfer pins 300 coupled to pin carriers 310 may be varied without departing from the spirit and scope of the present invention. The electrical interconnect plane could be a printed circuit board, a system utilizing discrete wire technology, or a similar system that requires the use of precisely located electrical signals for testing purposes.

What is claimed is:

1. A wireless test fixture for electrically connecting one or more limited-access test targets and one or more standard-access test targets on an electrical interconnect device under test with interface probes of a tester, said wireless test fixture comprising:

a probe mounting plate;

one or more double-ended receptacles suitable for use in the wireless fixture, coupled to one or more corresponding holes in the probe mounting plate;

one or more probes coupled to the one or more double-ended receptacles, said one or more probes being used to establish electrical contact to the device under test;

an upper frame coupled to the probe mounting plate, wherein said upper frame is operable to support the probe mounting plate;

a lower frame coupled to the upper frame;

an electrical interconnect plane coupled to one of the upper frame and the lower frame;

one or more spacer elements, strategically located between the probe mounting plate and the electrical interconnect plane;

one or more bottom support bars that are coupled to the lower frame;

one or more floating transfer pins, operable to be coupled to one or more test system interface pins and the electrical interconnect plane; and one or more pin carriers, coupled to the electrical interconnect plane and coupled to the bottom support bars.

2. The fixture of claim 1, wherein the probe mounting plate is constructed of epoxy-glass.

3. The fixture of claim 1, wherein the upper frame is directly coupled to the lower frame.

4. The fixture of claim 1, wherein the electrical interconnect plane is a printed circuit board.

5. The fixture of claim 1, wherein the electrical interconnect plane further comprises one or more electrical components.

6. The fixture of claim 1, wherein the one or more double-ended receptacles are double-ended sockets.

7. The fixture of claim 1, wherein the one or more double-ended receptacles are press-fit into the probe mounting plate.

8. The fixture of claim 1, wherein the one or more probes are spring probes.

9. The fixture of claim 1, wherein the upper frame provides a reference capability for location of said upper frame with respect to one or more of the lower frame, the double-ended socket hole pattern in the probe mounting plate, the electrical interconnect plane and the one or more probes.

10. The fixture of claim 1, wherein the lower frame provides a reference capability for location of said lower frame with respect to one or more of the upper frame, the electrical interconnect plane, the test system interface pins, and the one or more floating transfer pins.

11. The fixture of claim 1, wherein the wireless test fixture further comprises a second one or more insulating spacer elements coupled to the electrical interconnect plane and coupled to the lower frame.

12. The fixture of claim 11, wherein the one or more insulating spacer elements and the second one or more insulating spacer elements provide mechanical support and electrical insulation for the electrical interface plane.

13. The fixture of claim 1, wherein one or more guide plates are inserted between the electrical interconnect plane and the one or more spacers.

14. The fixture of claim 1, wherein the one or more bottom support bars are an integral part of the lower frame.

15. The fixture of claim 1, wherein the test system interface pin is a spring probe.

16. The fixture of claim 1, wherein at least one of the one or more floating transfer pins are spring probes.

17. The fixture of claim 1, wherein the one or more floating transfer pins are coupled to the electrical interconnect plane.

18. A wireless test fixture for electrically connecting one or more limited-access test targets and one or more standard-access test targets on a printed circuit board device under test with interface probes of a tester, said wireless test fixture comprising:

a probe mounting plate, constructed from epoxy-glass;

one or more double-ended sockets for wireless fixtures, press-fit into one or more corresponding holes in the probe mounting plate;

one or more spring probes coupled to the one or more double-ended sockets, said one or more spring probes being used to establish electrical contact to the device under test;

an upper frame coupled to the probe mounting plate, wherein said upper frame is operable to support the probe mounting plate and provide details for locating with respect to the double-ended socket hole pattern and a lower frame;

the lower frame coupled to the upper frame and coupled to an insulating spacer element which is further coupled to a electrical interconnect plane, wherein said lower frame provides details for locating with respect to the electrical interconnect plane, the upper frame, and one or more test system interface pins;

the electrical interconnect plane, coupled to one of the upper frame and the lower frame;

one or more spacer elements, operable to provide mechanical support and electrical insulation to the electrical interface plane, placed between, but not coupled to, the probe mounting plate and the electrical interconnect plane;

one or more bottom support bars that are coupled to the lower frame;

the one or more test system interface pins, coupled to one or more floating transfer pins and the electrical interconnect plane; and one or more pin carriers, coupled to the electrical interconnect plane, and coupled to the bottom support bar.

19. The fixture of claim 18, wherein one or more guide plates are inserted between the electrical interconnect plane and the one or more spacers.

20. The fixture of claim 18, wherein lower frame further comprises the one or more bottom support bars.

21. The fixture of claim 18, wherein the test system interface pin is a spring probe.

22. The fixture of claim 18, wherein one or more of the one or more floating transfer pins are spring probes.

23. The fixture of claim 18, wherein the one or more floating transfer pins are coupled to the electrical interconnect plane.

* * * * *